(12) United States Patent
Wang

(10) Patent No.: US 6,844,759 B2
(45) Date of Patent: Jan. 18, 2005

(54) METHOD AND CIRCUIT FOR ELIMINATING CHARGE INJECTION FROM TRANSISTOR SWITCHES

(75) Inventor: Chunyan Wang, Montreal (CA)

(73) Assignee: Concordia University, Montreal (CA)

( * ) Notice: Subject to any disclaimer, the term of this patent is extended or adjusted under 35 U.S.C. 154(b) by 0 days.

(21) Appl. No.: 10/457,779

(22) Filed: Jun. 10, 2003

(65) Prior Publication Data

US 2004/0252545 A1 Dec. 16, 2004

(51) Int. Cl.$^7$ ................................................ H03K 3/00
(52) U.S. Cl. ..................... 327/108; 327/377; 327/483
(58) Field of Search ........................ 327/108–112, 91, 327/94, 377, 483

(56) References Cited

U.S. PATENT DOCUMENTS

| | | | |
|---|---|---|---|
| 4,885,486 A | * | 12/1989 | Shekhawat et al. ......... 327/377 |
| 5,548,288 A | | 8/1996 | Lueng |
| 5,783,952 A | | 7/1998 | Kazazian |
| 6,133,765 A | | 10/2000 | Hughes |

OTHER PUBLICATIONS

Improved Two–Step Clock–Feedthrough Compensation Technique for Switched–Current Circuits, Markus Helfenstein et al., IEEE Transactions on Circuits and Systems –II:Analog and Digital Signal Processing, vol. 45, No 6, Jun. 1998, pp. 739–743.

New Clock–Feedthrough Compensation Scheme for Switched–Current Circuits, Byung–Moo Min et al., IEEE Transactions on Circuits and Systems–II: Analog and Digital Signal Processing, vol. 45, No 11, Nov. 1998, pp. 1508–1511.

\* cited by examiner

*Primary Examiner*—Kenneth B. Wells
(74) *Attorney, Agent, or Firm*—Alexandra Daoud; James Anglehart; Ogilvy Renault

(57) ABSTRACT

A method for reducing charge injection from a field effect transistor switch in a circuit being controlled by a timing signal having an operation cycle with at least a first phase and a second phase. A charge density is changed in at least one layer in a channel in the switch when the timing signal begins its operational cycle and is in the first phase. A depth of the layer is significantly reduced while the timing signal is still in the first phase before a transition of the timing signal from the first phase to the second phase. The timing signal is transitioned from the first phase to the second phase while the layer is significantly reduced.

24 Claims, 4 Drawing Sheets

US 6,844,759 B2

METHOD AND CIRCUIT FOR ELIMINATING CHARGE INJECTION FROM TRANSISTOR SWITCHES

FIELD OF THE INVENTION

The invention relates to the implementation of transistor switches in various applications. More specifically, it relates to a method for eliminating charge injection from transistor switches when used in various types of circuits.

BACKGROUND OF THE INVENTION

Transistor switches find many applications in integrated-circuit design. In analog circuits, the switch is used to implement such useful functions as sample-hold.

One of the most serious limitations of transistor switches is the charge injection effect. This is due to the charge released from the transistor channel, which is also called inversion layer beneath the gate, and injected into the connected drain and source nodes when the transistor is turned from on to off. Charge injection involves a complex process whose resulting effects depend upon a number of factors such as the dimension of the transistor, and the shape of the inversion layer in the gate area.

A number of techniques have been proposed to reduce the effect of charge injection. Some of them use additional devices attempting to cancel the injected charge, for example, using a dummy switch to absorb the charge. Some use differential switches so that the voltage variation produced by the switch pair can be cancelled as a common-mode noise. To apply such canceling techniques, a device matching is usually required, and multi-phase clocks, as well as extra bias signals, may be needed. Others try to make the operation of the circuits less sensitive to the charge injection, such as by deviating the charge, or part of it, from the critical circuit node. The objective of most of the reported technique is to reduce the impact of the charge injection after it occurs, instead of reducing the charge injection itself.

Therefore, there is a need to develop a method and circuit to eliminate charge injection, instead of dealing with the effects of the charge injection.

SUMMARY OF THE INVENTION

Accordingly, an object of the present invention is to eliminate charge in the MOS switch before any charge injection occurs.

Another object of the invention is to provide an easy and inexpensive solution to the problem of charge injection.

According to a first broad aspect of the present invention, there is provided a method for reducing charge injection from a field effect transistor switch in a circuit being controlled by a timing signal having an operation cycle comprising at least a first phase and a second phase, the method comprising: changing a charge density in at least one layer in a channel in the switch when the timing signal begins its operational cycle and is in the first phase; significantly reducing a depth of the layer while the timing signal is still in the first phase before a transition of the timing signal from the first phase to the second phase; and transitioning the timing signal from the first phase to the second phase while the layer is significantly reduced.

Preferably, the timing signal is maintained as a constant voltage swing and is applied to a control circuit that is then used to generate the modulated voltage signal to control the transistor switch so that the gate of the transistor switch is made variable. The voltage at the gate of the transistor switch is adjusted automatically, reducing significantly the voltage difference between the gate and the source to reduce the depth of the inversion layer in the transistor switch before the timing signal transitions from the first phase to the second phase. Also preferably, the inversion layer is completely removed from the transistor switch before the transition of the timing signal in order to eliminate as much charge in the transistor as possible.

According to a second broad aspect of the present invention, there is provided a circuit having a substantially eliminated charge injection, the circuit comprising: a field effect transistor switch having a gate, a first diffusion terminal, and a second diffusion terminal; functional circuitry connected to at least one of the first and second diffusion terminals of the transistor switch and adapted to perform a task; and control circuitry connected to the gate of the transistor switch for receiving a timing signal having an operational cycle of at least a first phase and a second phase and generating a modulated voltage signal at the gate of the switch, the control circuitry changing a charge density in at least one layer in a channel of the transistor switch when the timing signal begins the operational cycle and is in the first phase, and adapted to significantly reduce a depth of said layer while the timing signal is still in the first phase before a transition of the timing signal from the first phase to the second phase.

Preferably, the functional circuitry is circuitry for a switched current memory cell and the control circuitry is adapted to generate a varying voltage, from one with a constant-swing, to the gate of the transistor switch. The gate voltage should vary in such a way that the transistor switch is first driven in a good conduction state for a fast adjustment of the critical gate voltage and then it is turned off in order to eliminate the charge that would be injected. Also preferably, the layer is completely removed from the transistor switch, before the control signal transition.

BRIEF DESCRIPTION OF THE DRAWINGS

These and other features, aspects and advantages of the present invention will become better understood with regard to the following description and accompanying drawings wherein.

DETAILED DESCRIPTION OF THE PREFERRED EMBODIMENT

Although the preferred embodiment consists of a MOSFET switch for the transistor, it can be appreciated that the technique can be used for JFETs as well.

Figure 1:
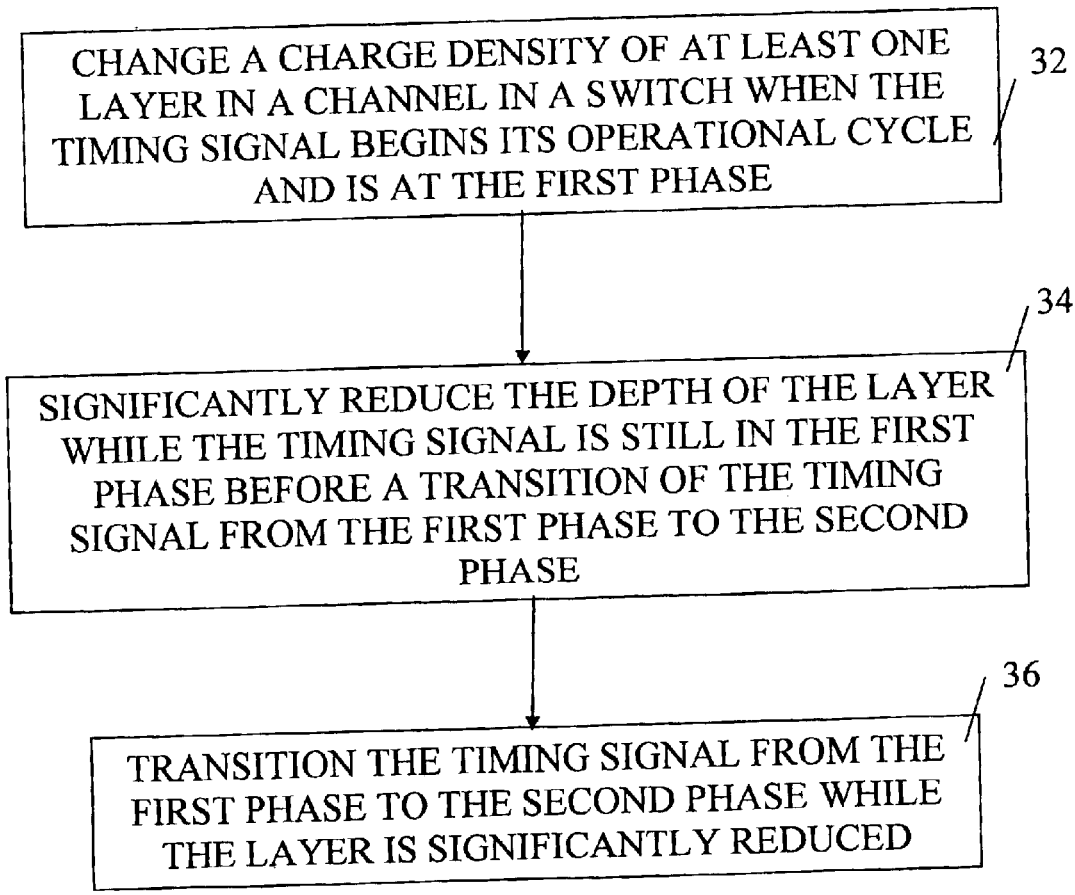
FIG. 1 is a flow chart of the method in accordance with the invention.

FIG. 1 is a flowchart of the method in accordance with the invention. It is a method for reducing charge injection from a field effect transistor switch in a circuit being controlled by a timing signal having an operation cycle comprising at least a first phase and a second phase. During phase 1, the timing signal is at a first voltage level and during phase 2, it is at a second voltage level. The first step is to change a charge density of at least one layer in a channel in the switch 32. In a conventional transistor, this means creating an inversion layer. If the transistor has a p-type substrate, then a layer beneath the gate and between the source and drain is inverted to n-type. If the transistor has an n-type substrate, then the inversion layer is a p-type layer.

In a Metal Oxide Semi-conductor Field Effect Transistor (MOSFET), the inversion layer is created, for a p-type substrate, by applying a positive gate-to-source voltage to the transistor and this voltage is equal or higher than the threshold voltage of the transistor. The positive voltage causes, in a first instance, the free holes (which are positively charged) to be repelled from the region of the substrate under the gate (the channel region). These holes are pushed downward into the substrate, leaving behind a carrier-depletion region. The depletion region is populated by the bound negative charge associated with the acceptor atoms. These charges are "uncovered" because the neutralizing holes have been pushed downward into the substrate. As well, the positive gate voltage attracts electrons from the highly doped n-type source and drain regions into the channel region. When a sufficient number of electrons accumulate near the surface of the substrate under the gate, an n-region is in effect created, connecting the source and drain regions. The channel is created by inverting the substrate surface from p-type to n-type. Hence, the induced channel is also called an inversion layer.

Similarly, a p-channel type MOSFET (PMOS transistor) is fabricated on an n-type substrate with p-type diffusion regions for the drain and source with holes as majority carriers. The device operates in the same manner as the n-channel device, except that $V_{gs}$ and $V_{ds}$ are negative and the threshold voltage $V_t$ is negative. Also, the current $i_D$ enters the source terminal and leaves through the drain terminal.

For both n-type and p-type transistors, the amount of charge in the inversion layer is related to the size of the gate area and the degree/depth of the inversion that depends on the gate-to-source voltage.

The next step of the method comprises reducing the depth of the layer 34. This is done while the connection by the switch is no longer needed but the timing signal is still at the first voltage level, i.e. in a first phase. In a preferred embodiment, the inversion layer is completely removed. Alternatively, the charge injection may be sufficiently reduced by simply driving the transistor into the weak inversion region and a minimum amount of charge is left in the channel. Ideally, this step is performed after the circuit has performed an initial task. For example, in the case of a switched current circuit, an initial task would be to sample an input current. This is usually done while the timing signal is in the first phase. Once this is done and while the timing signal is still in the first phase, the depth of the layer is reduced. This can be done by lowering the gate-to-source voltage of the MOS switch.

The last step of the method is to transition the timing signal from the first phase to the second phase, or from the first voltage level to the second voltage level 36. This is done while the layer is the weakest to avoid a significant effect of the charge injection.

Figure 4:
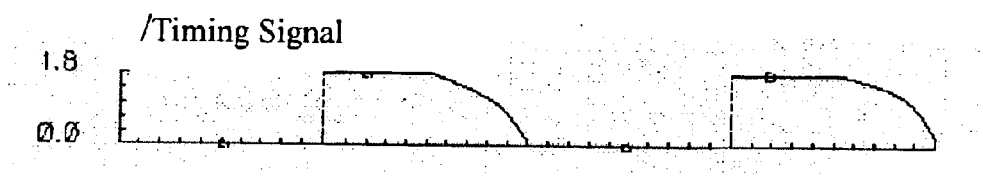
FIG. 4 is a modulated timing signal to apply to the gate of the switch.

There are a variety of ways in which the depth of the layer can be reduced 34. They all come down to the same principle: the gate-to-source voltage is varied during the first phase of the timing signal. This can be done by applying an amplitude-modulated timing signal to the switch. The modulated timing signal would have its voltage level gradually varied before the second phase starts. Therefore, the depth of the inversion layer of the transistor switch would subsequently be reduced as the voltage level decreases. An example of a modulated timing signal is shown in FIG. 4. The voltage rises to a high voltage level until the initial task of the circuit is completed and then is lowered gradually until it is low enough to make the depth of the inversion layer of the transistor switch removed or minimized. The gradual lowering of the voltage level is a transitional phase between the first phase and the second phase.

Alternatively, a control circuitry is provided between a timing signal and the gate of the MOS switch to generate a modulated voltage signal so that the gate-to-source voltage of the switch is varied during the first phase of the timing signal. The timing signal is maintained with a constant voltage swing and it is the modulated voltage signal generated which is applied to the gate of the MOS switch. This circuitry, which is initially run by the timing signal, is subsequently driven by the operation of the circuit. That is, the circuitry can automatically detect when a portion of the task is completed and the gate voltage can be lowered in order to reduce or remove the inversion layer in the gate area. The detection is done by providing a circuit that automatically responds with a timing characteristic adjusted to the task to be completed. For example, in the case of a switched-current circuit where the initial task is to sample an input current, the circuit first samples and once the current has been sampled, the circuit automatically begins to decrease the gate voltage of the switch. When the timing signal enters the second phase of the operational cycle, the hold function of the circuit begins.

Throughout the rest of the description, the preferred embodiment will be described with respect to a switched-current circuit. It can be appreciated that the solution proposed can be used for a variety of applications and should not be limited to a switched-current circuit.

Figure 2:
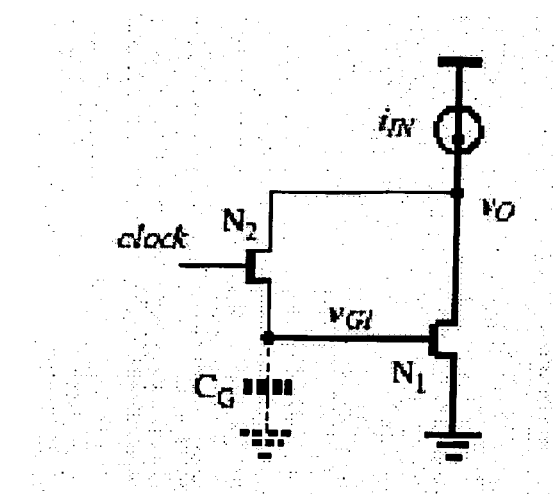
FIG. 2 is a prior art scheme of a switched-current memory cell.

The charge injection results in a voltage variation $\Delta V_{G1}$ at the node $V_{G1}$, as shown in FIG. 2 (prior art), and a current variation of $\Delta i_{N1}$ is then produced in the transistor $N_1$. The principle of the proposed elimination of the charge injection does not aim at eliminating $\Delta V_{G1}$ after it is generated, but eliminating $\Delta q$. This $\Delta q$ is related to the inversion layer of the MOS switch $N_2$ when it is on. If the inversion layer is removed at the time of the phase switching, no charge injection from the MOS switch will take place.

It should be noted that a MOS switch, such as $N_2$ in FIG. 2, needs to be on for the current sampling. Thus, during the sample phase, i.e. the first phase of the operation, the MOS switch should be first in a good conduction state for a fast adjustment of $V_{G1}$, i.e. a fast current sampling, then turned off before the timing signal changes its state to the second operational phase. In this case, the effect of the charge injection will be eliminated.

To eliminate the charge injection, the gate voltage of $N_2$ should be variable. However, if the timing signal is to maintain a constant voltage swing, a new circuit structure is needed to generate a level variable gate voltage for the MOS switch without making the timing signal complex. Such a circuit structure is shown in FIG. 3.

Figure 3:
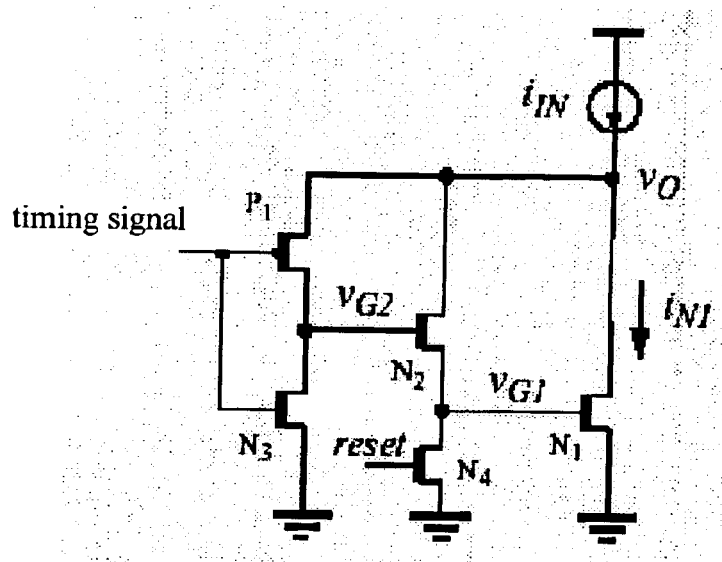
FIG. 3 is a switched-current memory cell with the circuit for reducing or eliminating the charge injection.
Figure 5A:
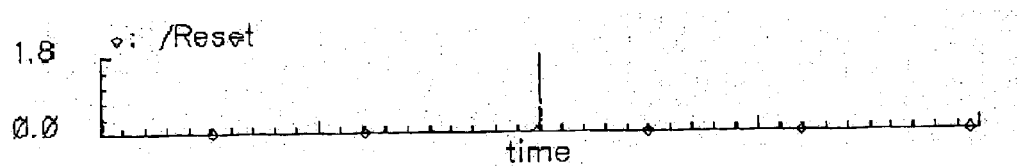
FIG. 5A is a graph of a simulated waveform for the reset signal from FIG. 3.
Figure 5B:
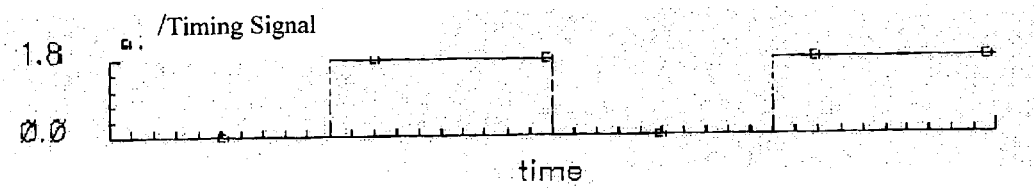
FIG. 5B is a graph of a simulated waveform for the timing signal from FIG. 3.
Figure 5C:
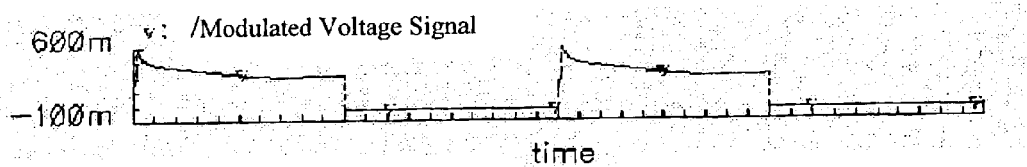
FIG. 5C is a graph of a simulated waveform for the control signal at the gate of transistor N2 from FIG. 3.

FIG. 3 shows a switched-current circuit with elimination of the charge injection. This circuit is a switched-current memory cell, one of the most important building blocks in switched-current circuits. In this cell, the transistor $N_1$ is the critical one of which the gate node voltage $V_{G1}$ (FIG. 5D) needs protection from switching noise, including that produced by the charge injection. The functional circuitry comprises transistor $N_1$ and $i_{IN}$ is the input signal current from another source. The circuitry performs a sample-hold of the input current. The voltage $V_{G2}$ (FIG. 5C) is variable during the sample phase. The transistor $P_1$ is added to adjust $V_{G2}$. The transistor $N_3$ is used to pull down $V_{G2}$ to zero volts during the second phase. $P_1$ and $N_3$ receive a timing signal and generate a modulated voltage signal which is applied to the gate of $N_2$. Transistors $P_1$ and $N_3$, forming the control circuitry, are used to generate modulated voltage signal $V_{G2}$ that is applied to the gate of the transistor switch $N_2$ and controls the inversion layer of the transistor switch $N_2$. Additionally, a transistor, $N_4$, is used to reset $V_{G1}$ to zero volts at the beginning of each operational cycle and is turned on only for that purpose (see FIG. 5A).

FIGS. 5A–5F show many simulation waveforms for the circuit. The simulation waveforms are of the reset signal, the timing signal, the modulated voltage signal ($V_{G2}$ from FIG. 3), $V_{G1}$, $V_O$, and the current in transistor $N_1$. At the end of the first phase, i.e. just before the timing signal is switched to its high level, the gate-to-source voltage of $N_2$, which is $V_{G2}-V_{G1}$ is small enough to turn the transistor off.

Figure 5D:
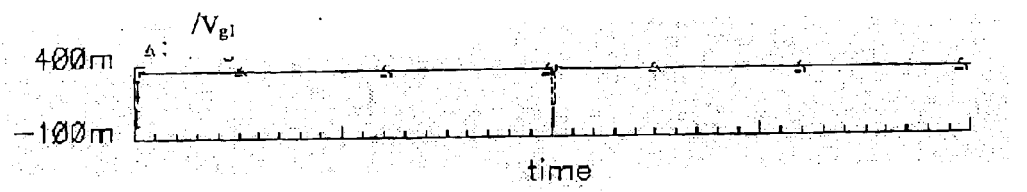
FIG. 5D is a graph of a simulated waveform for the gate voltage of transistor N1 from FIG. 3.
Figure 5E:
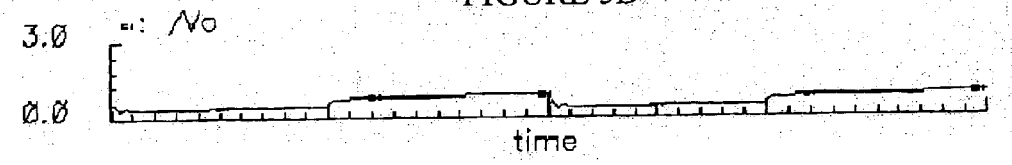
FIG. 5E is a graph of a simulated waveform for the voltage at node $V_O$ from FIG. 3.
Figure 5F:
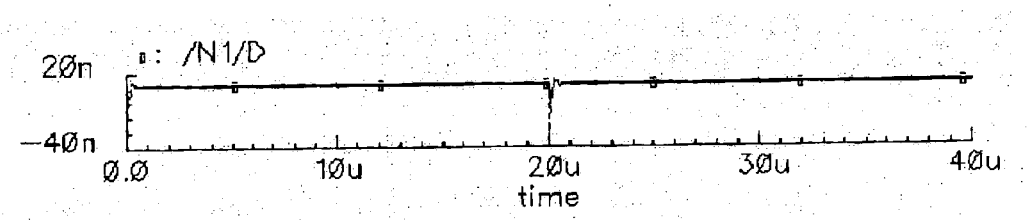
FIG. 5F is a graph of a simulated waveform for the current in transistor N1 from FIG. 3.

The circuit operates as follows. In phase one of the operation, the timing signal is at zero volts (FIG. 5B), the circuit is sampling the current $i_{IN}$, and $N_3$ is off. As the gate voltage $V_{G1}$ is initially low, $i_{N1}<<i_{IN}$ at the beginning of the phase. The voltage $V_O$ (FIG. 5E) increases quickly, raising $V_{G2}$ (FIG. 5C) and $V_{G1}$ (FIG. 5D). Thus, both $P_1$ and $N_2$ are turned on so that $V_{G2}$ and $V_{G1}$ can be varied to adjust the current $_1N_1$. When the level of $i_{N1}$ (FIG. 5F) is approaching that of $i_{IN}$, the current of PI and that of $N_2$ approach zero. At this moment, if $N_2$ is still on, the voltage $V_O$ will approach $V_{G1}$ and $V_O<V_{G2}$. In this case, $P_1$ has to have a current flowing from node $V_{G2}$ to node $V_O$, which lowers the voltage $V_{G2}$. The following steady state can be one of two cases: $V_{G2}=V_O$, or $V_{G2}=-V_{tp1}$, where $V_{tp1}$, is the threshold voltage of $P_1$. In the first case, the current of $P_1$ becomes zero because $V_{G2}$, the source voltage of $P_1$ is lowered to be equal to its drain voltage. The second case happens as $i_{N1}$ is very weak and $V_{G1}$ is very low. When $V_{G2}$ is lowered to the level of $|V_{tp1}|$, the current of $P_1$ stops. Thus, $V_{G2}$ cannot be lowered to the level of $V_O$. In either of the two cases, the potential difference between $V_{G2}$ and $V_{G1}$ is not big, enough for an inversion layer to exist in the MOS switch $N_2$. Therefore, the, inversion layer appearing at the beginning of the phase has been removed when $V_{G2}$ is lowered.

In phase two of the operation, the timing signal is at $V_{DD}$, and $P_1$ is off. Transistor $N_3$ is turned on, discharging quickly the capacitor at the gate of $N_2$. This ensures the off state of $N_2$. During this phase, there is no DC path to the critical gate node $V_{G1}$.

Figure 6:
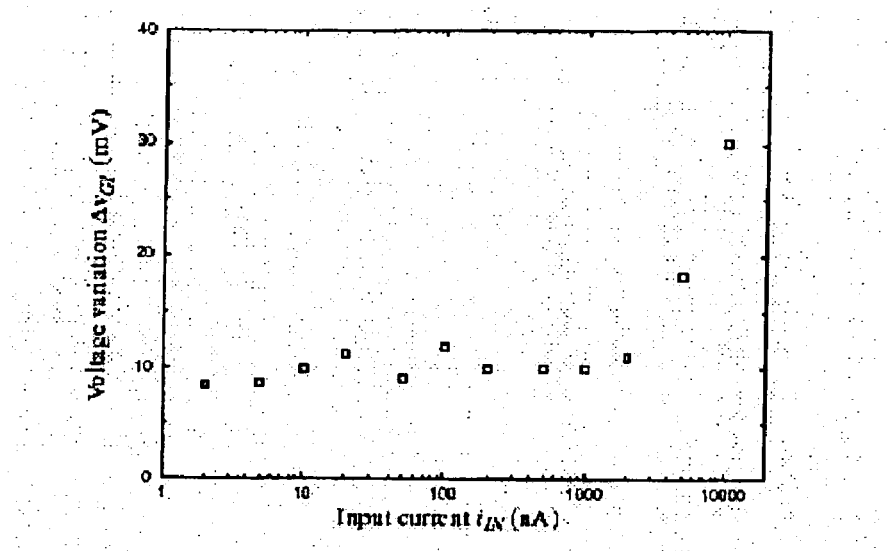
FIG. 6 is a graph of the voltage variation at the critical gate node of transistor N1 versus the input current of the circuit of FIG. 3.
Figure 7:
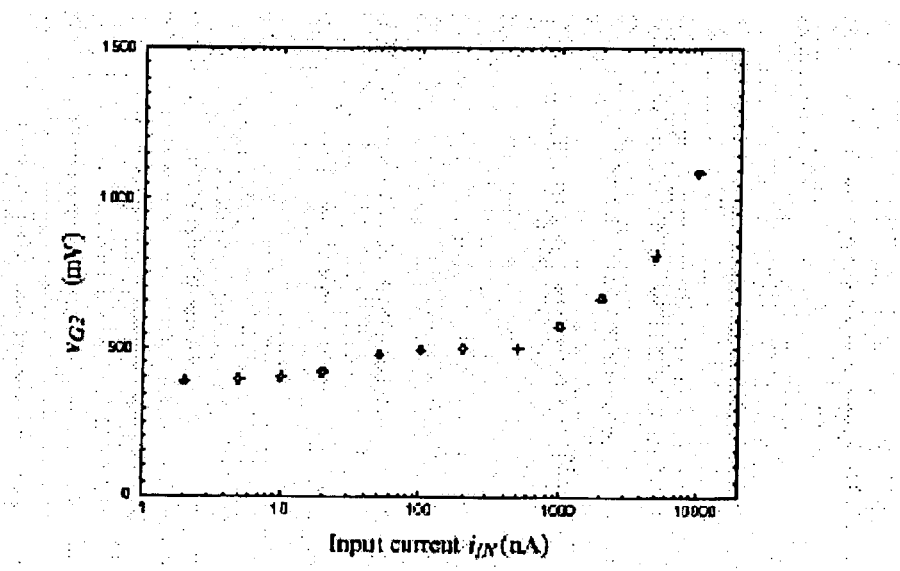
FIG. 7 is a graph of the gate voltage of the MOS switch $N_2$ at the end of the first phase versus the input current of the circuit of FIG. 3.

The circuit shown in FIG. 3 has been simulated with HSPICE using the transistor models of a 0.18 $\mu$m technology. Most of the transistors are minimum sized. The capacitance at the critical gate node $V_{G1}$ is mainly contributed by the transistor gate sized 0.22 $\mu m^2$. No additional capacitance is introduced at this gate node so that the node capacitance is kept minimum and the voltage variation at this gate can be observed easily. Without any measures to reduce the charge injection, the voltage variation of $\Delta V_{G1}$ due to the switching is greater than 100 mV. However, with the same $N_1$, the same $N_2$ and the same capacitance at the gate of $N_1$, the voltage variation of $\Delta V_{G1}$ is considerably reduced with the structure of FIG. 3. The characteristic of the reduced $\Delta V_{G1}$ versus $i_{IN}$, the input current, is shown in FIG. 6. The gate voltage of $V_{G2}$ at the end of the first phase versus $i_{IN}$ is shown in FIG. 7. These results confirm the following points.

Within a current range from 2 $\mu$A to 2 $\mu$A, $\Delta V_{G1}$ is about 10 mV. The elimination of the charge injection make the gate voltage variation at least one decade smaller than that without the elimination procedure implemented. This reduction of the gate voltage variation can result in an even more significant reduction of the undesirable current variation in the transistor $N_1$. Particularly, when the transistor is in the weak inversion mode with a very weak input current, the transistor current increases exponentially with the gate-to-source voltage. In this case, the proposed method of eliminating charge injection will result in a very impressive suppression of the current noise caused by the switching noise.

At the end of the first phase, ($V_{G2}-V_{G1}$), the gate-to-source voltage of the MOS switch $N_2$, is not greater than 100 mV. It is thus confirmed that, at that moment, $N_2$ is already in the cut-off mode, or in the depletion mode. There is therefore, no inversion layer in the MOS switch when the operation phase is switched.

In the lower part of the current range, as shown in FIG. 7, $V_{G2}$ is equal to the threshold voltage of the transistor $P_1$ (around 500 mV). If $V_{G1}$ is changed by a change of $i_{IN}$, this threshold voltage is slightly modified due to the body effect. In the upper part of the current range, $V_{G2}=V_O$.

Within the current range fro 2 $\mu$A to 2 $\mu$A, $\Delta V_{G1}$ is not caused by the injection of the charge from the MOS switch, but by the drop of $V_{G2}$ coupled by the gate-diffusion capacitance of $N_2$ at the moment of switching.

The circuit does not contain any large capacitors and its sample phase can be very short. For an input current of 10nA, the sampling time is about 1 $\mu$s. Considering the very weak operating current, the operation speed is quite high. In the aspect of power, as the circuit has zero DC bias current, the power dissipation of the circuit is proportional to the input current. If the input current is in a nA level, the power dissipation will be in a nW level.

The most significant advantage of the proposed approach is the efficiency of the reduction of the switching noise. This reduction is achieved at almost no expenses of devices and controls, as it requires neither matching devices, nor passive components (constant resistance or capacitance), nor specifically sized transistors or special fabrication processes. This noise reduction is done without sacrificing the operation speed and with little additional power dissipation. Moreover, this reduction is effective and efficient, enabling the circuits to function correctly over a wide range of the input current, in particular, in the range of nA or below.

The potential applications of the new approach and circuits can be in all applications cases of switched-current circuits, including current based sensor circuits (ex. optical sensors, biomedical sensors, and other perception circuits), current mode data converters, and current mode processing circuits and signal generators.

It will be understood that numerous modifications thereto will appear to those skilled in the art. Accordingly, the above description and accompanying drawings should be taken as illustrative of the invention and not in a limiting sense. It will further be understood that it is intended to cover any variations, uses, or adaptions of the invention following, in general, the principles of the invention and including such departures from the present disclosure as come within known or customary practice within the art to which the invention pertains and as may be applied to the essential features herein before set forth, and as follows in the scope of the appended claims.

What is claimed is:

1. A method for reducing charge injection from a field effect transistor switch in a circuit being controlled by a timing signal having an operation cycle comprising at least a first phase and a second phase, the method comprising:

changing a charge density in at least one layer in a channel in said switch when said timing signal begins its operational cycle and is in said first phase;

significantly reducing a depth of said layer while said timing signal is still in said first phase before a transition of said timing signal from said first phase to said second phase; whereby said switch is substantially turned off before said transition of bald timing signal; and transitioning said timing signal from said first phase to said second phase while said layer is significantly reduced.

2. A method as claimed in claim 1, wherein a modulated voltage signal is generated from said timing signal and with a decay ocurring during said first phase of said timing signal and said modulated voltage signal is applied to a gate of said transistor switch to change said charge density and significantly reduce a depth of said layer.

3. A method as claimed in claim 1, wherein said timing signal is a modulated timing signal having a transitional phase before said second phase, and said significantly reducing a depth of said layer comprises entering said transitional phase to reduce a potential difference between said gate and a diffusion terminal of said transistor switch gradually.

4. A method as claimed in claim 2, wherein said significantly reducing a depth of said layer comprises substantially reducing a potential difference between said gate and a diffusion terminal of said transistor switch after an initial task of said circuit has been completed and before said timing signal transitions from said first phase to said second phase.

5. A method as claimed in claim 4, wherein said initial task is sampling an input current in a switched-current circuit.

6. A method as claimed in claim 5, wherein said reducing a potential difference comprises providing a first transistor at said gate of said transistor switch such that said first transistor has a substantially zero current flowing therethrough in steady state.

7. A method as claimed in claim 5, wherein said reducing a potential difference comprises making said potential difference too small for said inversion layer to exist.

8. A method as claimed in claim 7, wherein said potential difference is minimized by providing a connection to act as a current path for modulating said modulated voltage signal at said gate of said transistor switch.

9. A method as claimed in claim 4, wherein said significantly reducing a depth of said layer comprises automatically detecting that said initial task of said circuit has been completed and said transistor switch is ready to be turned off according to a timing characteristic adjusted to said task.

10. A method as claimed in claim 1, wherein said significantly reducing a depth of said layer comprises substantially removing said layer.

11. A method as claimed in claim 10, further comprising substantially removing said layer by reducing a gate terminal voltage of said transistor switch to substantially zero while said timing signal is in said second phase.

12. A circuit having a substantially eliminated charge injection, said circuit comprising:

a field effect transistor switch having a gate, a first diffusion terminal, and a second diffusion terminal;

functional circuitry connected to at least one of said first and second diffusion terminals of said transistor switch and adapted to perform a task; and control circuitry connected to said gate of said transistor switch cable of receiving a timing signal having an operational cycle of at least a first phase and a second phase and generating a modulated voltage signal at said gate of said switch, said control circuitry changing a charge density in at least one layer in a channel of said transistor switch when said timing signal begins said operational cycle and is in said first phase, and adapted to significantly reduce a depth of said layer while said timing signal is still in said first phase before a transition of said timing signal from said first phase to said second phase, whereby said switch is substantially turned off before said transition.

13. A circuit as claimed in claim 12, wherein said modulated voltage signal follows a course dictated by at least one of said functional circuitry and said control circuitry.

14. A circuit as claimed in claim 12, wherein said control circuitry receives a modulated timing signal having a transitional phase before said second phase and applies said modulated timing signal to said gate of said switch, and said depth of said layer is reduced by entering said transitional phase to reduce a potential difference between said gate and said second diffusion terminal of said transistor switch gradually.

15. A circuit as claimed in claim 12, wherein said control circuitry automatically detects when a portion of said task is completed and said transistor switch is ready to be turned off according to a timing characteristic of said functional circuitry.

16. A circuit as claimed in claim 12, wherein said control circuitry at said gate of said transistor switch comprises a first transistor cascoded with a second transistor, said first and second transistor connected to said gate of said transistor switch via respective first diffusion terminals, said first transistor having a second diffusion terminal connected to a node of said functional circuitry and said second transistor having a second diffusion terminal connected to a common terminal; and wherein said first transistor is turned on during said first phase and said second transistor is turned on during said second phase of said timing signal.

17. A circuit as claimed in claim 16, wherein said first transistor is a PMOS transistor and said second transistor is an NMOS transistor.

18. A circuit as claimed in claim 16, wherein said control circuitry also comprises a third transistor connected to a terminal of said functional circuitry for resetting said functional circuitry before each of said operational cycles.

19. A circuit as claimed in claim 12, wherein said charge injection affects a voltage level of said functional circuitry which is consequential to a primary function of said functional circuitry.

20. A circuit as claimed in claim 19, wherein said circuit is a switched-current memory cell.

21. A circuit as claimed in claim 12, wherein said field effect transistor switch is a metal oxide semiconductor field effect transistor switch.

22. A circuit as claimed in claim 12, wherein said control circuitry significantly reduces a depth of said layer by substantially reducing a potential difference between said gate and said second diffusion terminal of said transistor switch after said task of circuit has been completed and before said timing signal transitions from said first phase to said second phase.

23. A circuit as claimed in claim 22, wherein said potential difference is reduced by a first transistor in said control circuitry which is connected to said transistor switch such that said first transistor has a substantially zero current flowing therethrough at steady state and said first transistor acts as a current path at said gate of said transistor switch in order to reduce said potential difference.

24. A circuit as claimed in claim 23, wherein said first diffusion terminal of said transistor switch is connected to a first diffusion terminal of said first transistor and said gate of said transistor switch is connected to a second diffusion terminal of said first transistor, and currents in said first transistor and said transistor switch become zero when said modulated voltage signal at said gate of said transistor switch is stabilized at the end of said first phase.

* * * * *